US012620439B2

(12) United States Patent
Takenaka

(10) Patent No.: US 12,620,439 B2
(45) Date of Patent: May 5, 2026

(54) NON-VOLATILE MEMORY DEVICE

(71) Applicant: ROHM CO., LTD., Kyoto (JP)

(72) Inventor: Seiji Takenaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 102 days.

(21) Appl. No.: 18/788,926

(22) Filed: Jul. 30, 2024

(65) Prior Publication Data

US 2024/0386952 A1 Nov. 21, 2024

Related U.S. Application Data

(63) Continuation of application No. PCT/JP2023/003014, filed on Jan. 31, 2023.

(30) Foreign Application Priority Data

Feb. 2, 2022 (JP) ................................. 2022-014738

(51) Int. Cl.
*G11C 13/00* (2006.01)
*G11C 5/14* (2006.01)
(52) U.S. Cl.
CPC .......... *G11C 13/0038* (2013.01); *G11C 5/147* (2013.01); *G11C 13/0097* (2013.01)

(58) Field of Classification Search
CPC ............................ G11C 13/0038; G11C 5/147
See application file for complete search history.

(56) References Cited

FOREIGN PATENT DOCUMENTS

JP 2011-103158 5/2011

OTHER PUBLICATIONS

International Search Report and Written Opinion in International Appln. No. PCT/JP2023/003014, mailed on Apr. 18, 2023, 13 pages.

*Primary Examiner* — Hoai V Ho
*Assistant Examiner* — Anthony Thinh Tang
(74) *Attorney, Agent, or Firm* — Fish & Richardson P.C.

(57) ABSTRACT

A non-volatile memory device (1) includes a memory element (4) that can perform a program operation, a switch (9) having its first terminal connected to an application terminal for a first supply voltage (VDD), an even number of inverters (5, 6) of which input side is connected to a first node (N1) to which the second terminal of the switch and the memory element are connected, and a current limiter (8) that limits the current flowing through the path via the application terminal for the first supply voltage, the transistor, and the memory element when a high-side transistor (61) included in the final-stage inverter (6) arranged in the final stage in the even number of inverters is on.

6 Claims, 9 Drawing Sheets

1

NON-VOLATILE MEMORY DEVICE

CROSS-REFERENCE TO RELATED APPLICATIONS

This nonprovisional application is a continuation application of International Patent Application No. PCT/JP2023/003014 filed on Jan. 31, 2023, which claims priority Japanese Patent Application No. 2022-014738 filed on Feb. 2, 2022, the entire contents of which are hereby incorporated by reference.

TECHNICAL FIELD

The present disclosure relates to a non-volatile memory device.

BACKGROUND ART

Some known non-volatile memory devices employ hot carrier injection into transistors. This kind of non-volatile memory device includes as memory elements a first and a second transistor that have paired characteristics in their initial state and the characteristics of one of the transistors are changed by hot carrier injection. After that, in a read operation, based on the magnitude relationship between the drain currents of the first and second transistors as observed when a common gate voltage is fed to them, whether data "0" or data "1" is stored is read out. For example, a state where the drain current of the first transistor is lower (a state where the characteristics of the first transistor have been changed) corresponds to a state where data "0" is stored, and a state where the drain current of the second transistor is lower (a state where the characteristics of the second transistor have been changed) corresponds to a state where data "1" is stored.

An example of technology related to what has just been mentioned is disclosed in Patent Document 1.

CITATION LIST

Patent Literature

Patent Document 1: Japanese Unexamined Patent Application Publication No. 2011-103158

DESCRIPTION OF EMBODIMENTS

Hereinafter, an illustrative embodiment will be described with reference to the drawings. Any of the non-volatile memory devices described below can be configured as a semiconductor integrated circuit.

1. First Embodiment

Figure 1A:
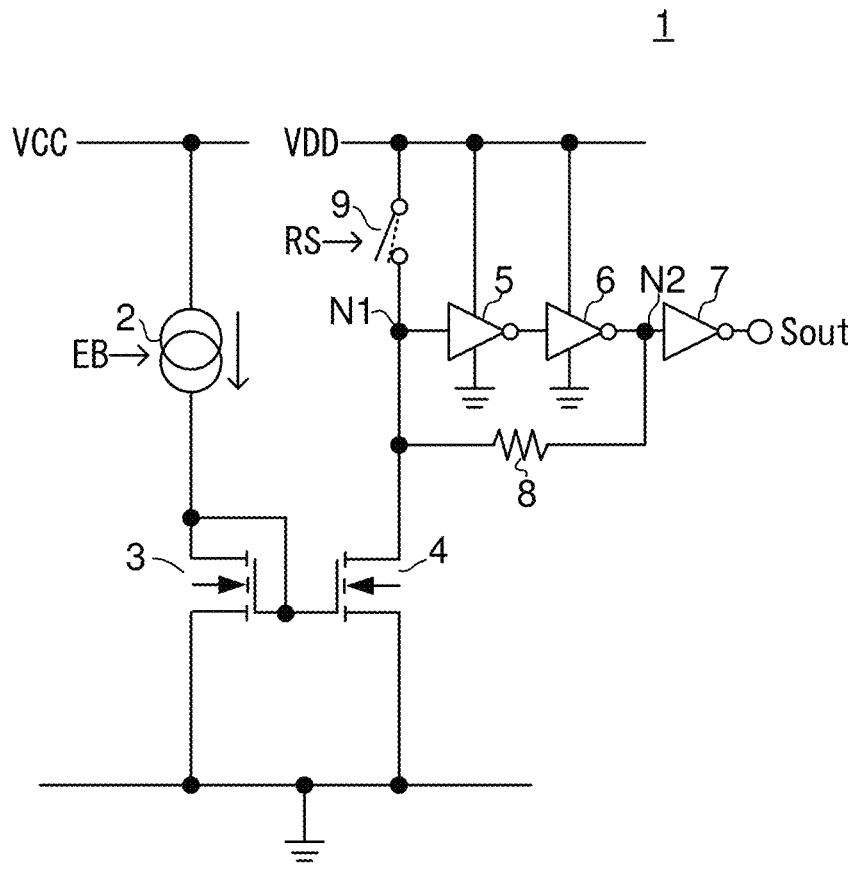
FIG. 1A is a diagram showing the configuration of a non-volatile memory device according to a first embodiment.

FIG. 1A is a diagram showing the configuration of a non-volatile memory device 1 according to a first embodiment. The non-volatile memory device 1 shown in FIG. 1A includes a constant current source 2, a reference element 3, a data element 4, inverters 5 to 7, a resistive element 8, and a switch 9.

The reference element 3 and the data element 4 are both configured as memory elements and are configured, more specifically, as NMOS transistors (N-channel MOSFET (metal-oxide-semiconductor field-effect transistors)). A memory element is an element that can perform a program operation by changing the characteristics of a transistor by hot carrier injection, and is also called an OTP (one-time programmable) element. The data element 4 is the target for which the program operations is performed.

The gate and the drain of the reference element 3 are short-circuited together. The constant current source 2 is connected between the drain of the reference element 3 and an application terminal for a supply voltage VCC. The source of the reference terminal 3 is connected to a ground terminal (an application terminal for a ground potential).

The gate of the data element 4 is connected to the gate of the reference element 3. The source of the data element 4 is connected to the ground terminal. Thus, the reference element 3 and the data element 4 constitute a current mirror.

One terminal of the switch 9 is connected to an application terminal for the supply voltage VDD. The other terminal of the switch 9 is connected to the drain of the data element 4 at a node N1. The node N1 is connected to the input terminal of the inverter 5. The input terminal of the inverter 6 is connected to the output terminal of the inverter 5. The output terminal of the inverter 6 is connected to the input terminal of the inverter 7 at a node N2. The node N2 is connected to one terminal of the resistive element 8. The other terminal of the resistive element 8 is connected to the drain of the data element 4 (node N1). The number of inverters between the nodes N1 and N2 is not limited to two, like the inverters 5 and 6; any even number other than two of them may be provided.

Figure 1B:
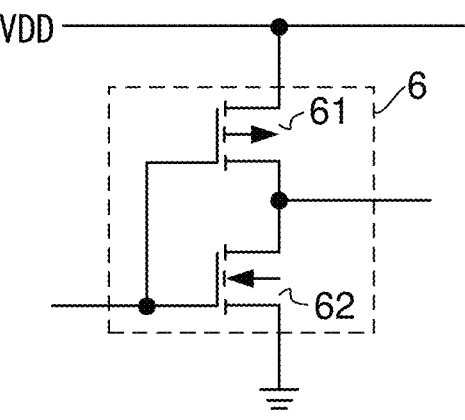
FIG. 1B is a diagram showing a configuration example of an inverter in the first embodiment.

The inverters 5 and 6 are connected between the supply voltage VDD and the ground terminal. The inverters 5 to 7 are configured to have a high-side PMOS transistor (P-channel MOSFET) and a low-side NMOS transistor connected in series. FIG. 1B shows a specific configuration example of the inverter 6. The inverter 6 includes a high-side PMOS transistor 61 and a low-side NMOS transistor 62. The source of the PMOS transistor 61 is connected to the application terminal for the supply voltage VDD. The drain of the PMOS transistor 61 is connected to the drain of the NMOS transistor 62. The source of the NMOS transistor 62 is connected to the ground terminal. The gate of the PMOS transistor 61 and the gate of the NMOS transistor 62 are connected together.

The supply voltage VCC is a peripheral-system supply voltage and is, for example, 5 V. The supply voltage VDD is a logic-system supply voltage and is a voltage lower than the supply voltage VCC, being, for example, 1.5 V.

The reference element 3 and the data element 4 have the same structure and have the same electrical characteristics before the program operation is performed. The target for the program operation is the data element 4. Thus, before the program operation is performed, the data element 4 and the reference element 3 have the same gate threshold value voltage.

Figure 2:
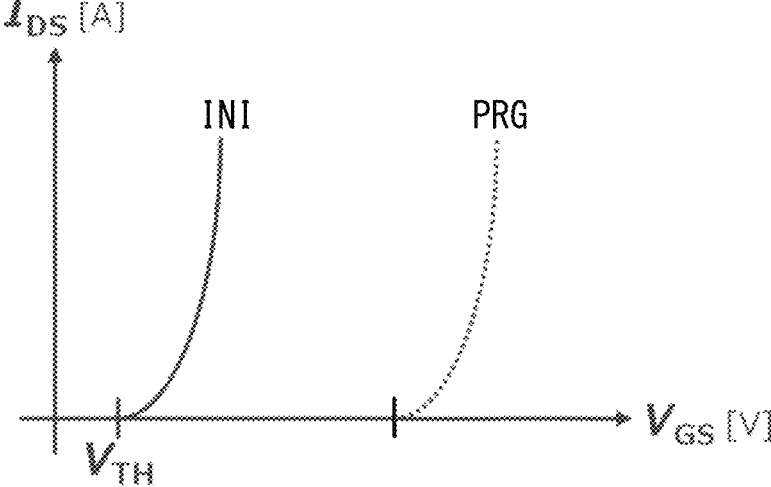
FIG. 2 is a diagram showing the gate-source voltage dependence of the drain current of a data element.

The program operation is carried out by a program circuit (not illustrated). The program circuit changes the electrical characteristics of the data element 4 by injecting hot carriers into the data element 4 in the program operation. This change rases the gate threshold value voltage of the data element 4. In FIG. 2, a solid-line waveform INI indicates the gate-source voltage dependence of the drain current of the data element 4 before the program operation is performed and a dotted-line waveform PRG indicates the gate-source voltage dependence of the drain current of the data element 4 after the program operation is performed. In this way, the program operation rases the gate threshold value voltage Vth.

The program operation is performed, for example, by feeding the gate of the data element 4 with the supply voltage VCC, its source with VCC, and its drain with the ground potential (0 V).

The constant current source 2 is switched between an enabled state and a disabled state according to an enable signal EB. The switch 9 is switched between on (reset state) and off (non-reset state) according to a reset signal RS.

When with the constant current source 2 in the enabled state the switch 9 is turned from on (broken line in FIG. 1) to off (solid line in FIG. 1), the switch 9 is switched from the reset state to the non-reset state and a read operation is started. When the switch 9 is on, the node N1 is at high level.

Figure 3:
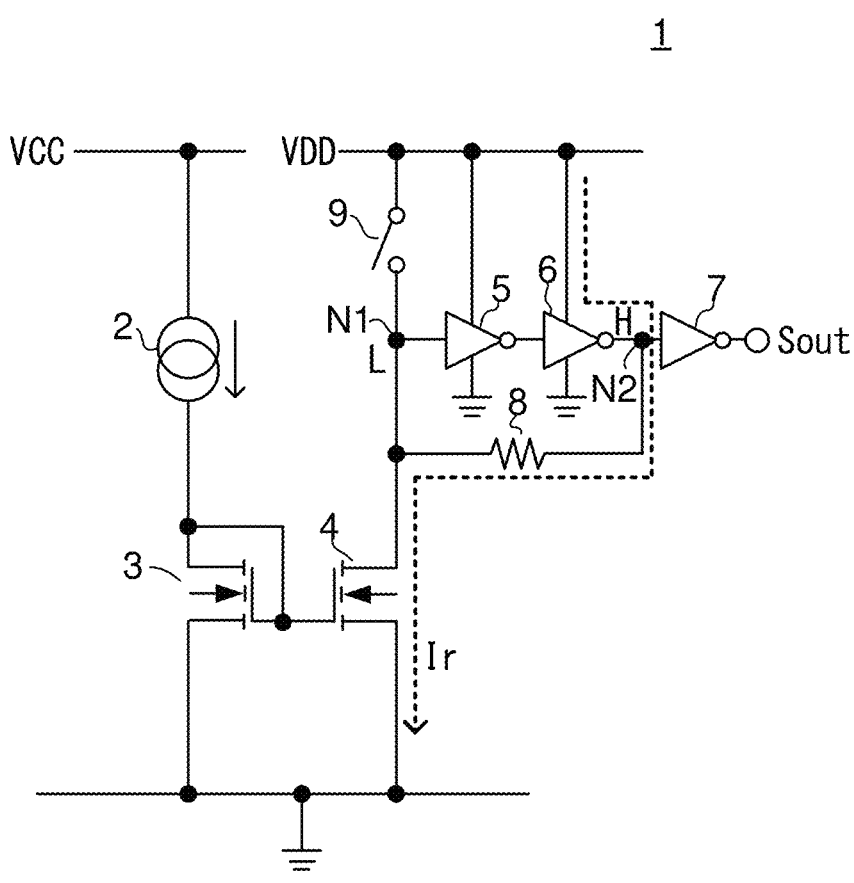
FIG. 3 is a diagram showing a state, during a read operation, of the non-volatile memory device according to the first embodiment (with a data element before a program operation).

Here, if the data element 4 is in a state before the program operation is performed (un-programmed state), as shown in FIG. 3, the high-side PMOS transistor 61 in the inverter 6 is on and so the node N2 is at high level; thus, a current Ir flows from the application terminal for the supply voltage VDD via the inverter 6 (PMOS transistor 61), the node N2, the resistive element 8, and the data element 4. The resistive element 8 is one example of a current limiter. The voltage drop across the resistive element 8 keeps the node N1 at low level.

Figure 4:
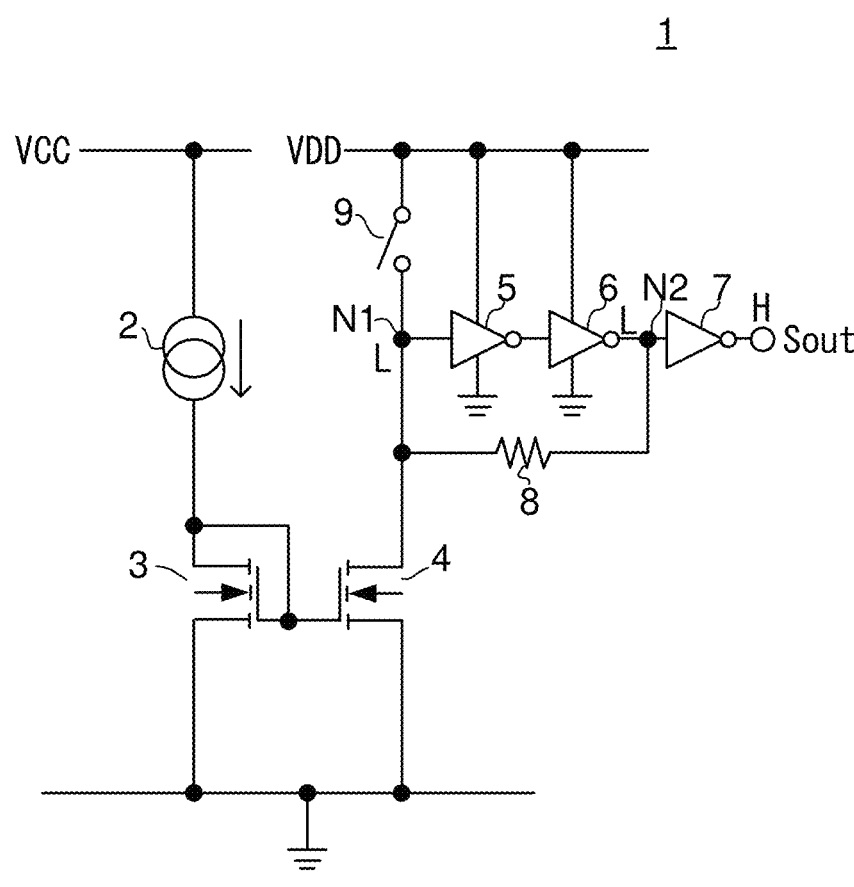
FIG. 4 is a diagram showing a state, after the read operation, of the non-volatile memory device according to the first embodiment (with the data element before the program operation).

As shown in FIG. 4, the node N1 is at low level; thus, the inverters 5 and 6 keep the node N2 at low level and no current Ir flows. The node N2 is latched at low level and an output signal Sout output from the inverter 7 is latched at high level.

Figure 5:
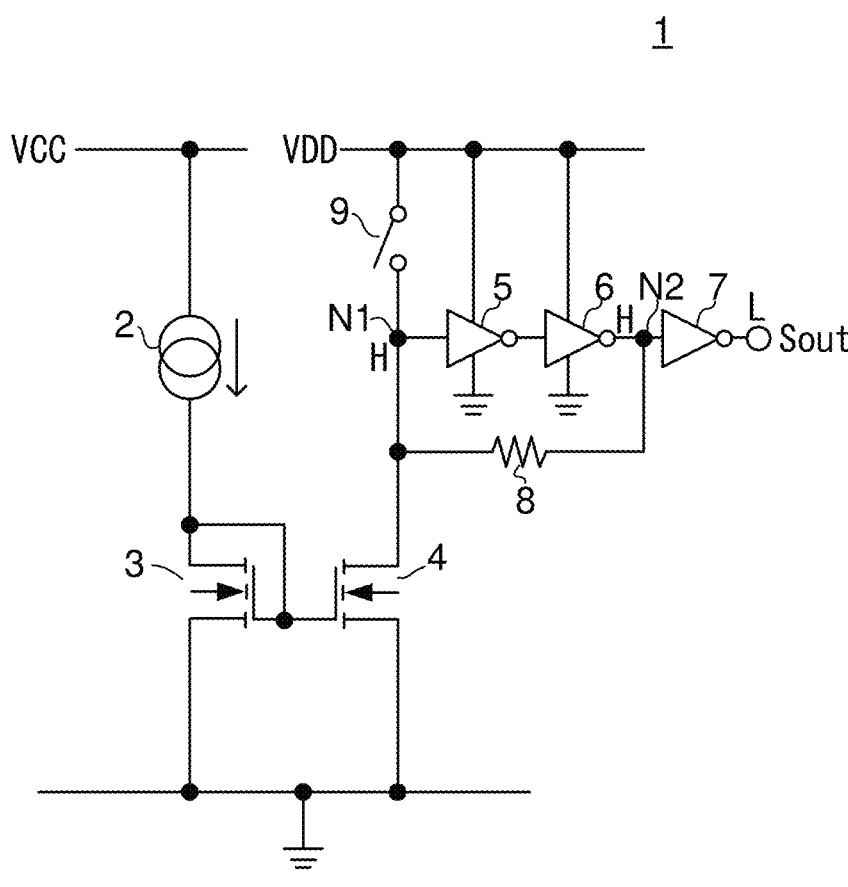
FIG. 5 is a diagram showing a state, after the read operation, of the non-volatile memory device according to the first embodiment (with the data element after the program operation).

By contrast, if the data element 4 is in a state after the program operation is performed, when the switch 9 comes into the non-reset state, no current flows through the data element 4. Thus, as shown in FIG. 5, the nodes N1 and N2 are latched at high level and the output signal Sout is latched at low level.

As described above, with the data element 4 in a state before the program operation is performed, while the current Ir flows during the read operation, no current Ir flows through the data element 4 after the read operation and the output signal Sout is latched at high level indicating that, for example, data "0" is stored. By contrast, with the data element 4 in a state after the program operation is performed, after the read operation, the output signal Sout is latched at low level indicating that, for example, data "1" is stored and no current flows through the data element 4. Thus, in the non-volatile memory device 1 according to this embodiment, after the read operation, no current flows through the data element 4 and the read data is held. It is thus possible to prevent power consumption after the read operation. After the read operation, regardless of whether the constant current source 2 is in the enable state or not, the output signal Sout is latched.

In this embodiment, the supply voltage VDD is a logic-system voltage lower than the supply voltage VCC and the variation width of the supply voltage VDD is small (for example, 1.5 V±3%). Thus, despite the use of the resistive element 8, the current Ir can be considered to be a substantially constant current even if the supply voltage VDD varies.

2. Second Embodiment

Figure 6:
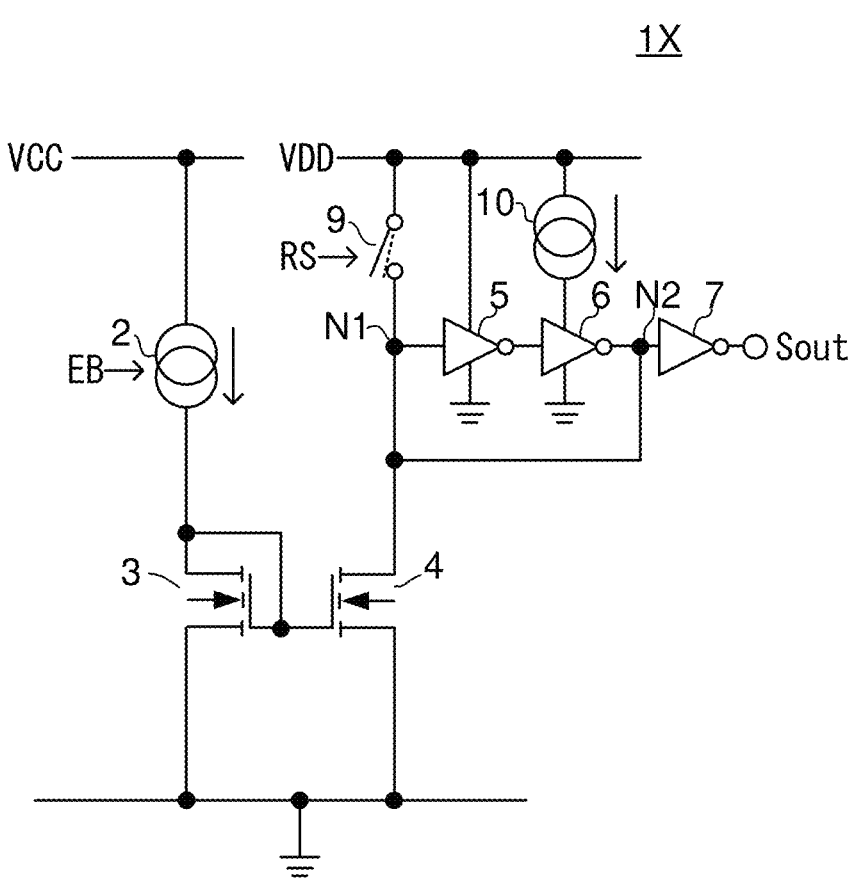
FIG. 6 is a diagram showing the configuration of a non-volatile memory device according to a second embodiment.

FIG. 6 is a diagram showing the configuration of a non-volatile memory device 1X according to a second embodiment. The non-volatile memory device 1X differs in configuration from the first embodiment (see FIG. 1) in that the nodes N2 and N1 are short-circuited together with the resistive element 8 omitted and in that a constant current source 10 is provided between the application terminal for the supply voltage VDD and the inverter 6. The constant current source 10 is one example of a current limiter.

Figure 7:
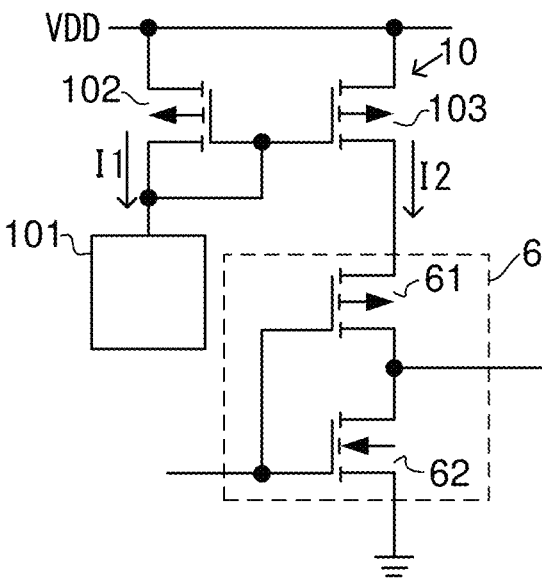
FIG. 7 is a diagram showing a configuration example of a constant current source in the second embodiment.

FIG. 7 is a diagram showing a specific configuration example of the constant current source 10. The constant current source 10 shown in FIG. 7 includes a constant-current generation circuit 101 and PMOS transistors 102 and 103. The gate and the drain of the PMOS transistor 102 are short-circuited together. The source of the PMOS transistor 102 is connected to the application terminal for the supply voltage VDD. The drain of the PMOS transistor 102 is connected to the constant-current generation circuit 101. The gate of the PMOS transistor 102 and the gate of the PMOS transistor 103 are connected together. The source of the PMOS transistor 103 is connected to the application terminal for the supply voltage VDD. The PMOS transistors 102 and 103 constitute a current mirror. The drain of the PMOS transistor 103 is connected to the source of the high-side PMOS transistor 61 in the inverter 6.

In the non-volatile memory device 1X according to this embodiment, when with the constant current source 2 in the enable state the switch 9 is switched to the non-reset state, if the data element 4 in a state before the program operation is performed, the PMOS transistor 61 in the inverter 6 is on, so the current I1 (see FIG. 7) generated by the constant-current generation circuit 101 is mirrored by the current mirror to produce the current I2 flowing through the PMOS transistor 103. The current I2 flows through a path via the PMOS transistor 61, the node N2, and the data element 4. Thus, the node N1 is at low level, the inverters 5 and 6 keep the node N2 at low level, no current flows through the data element 4, the node N2 is latched at low level, and the output signal Sout is latched at high level.

In this embodiment described above, the supply voltage VDD is set to a voltage (for example, 5 V) close to the supply voltage VCC and, if the variation width of the supply voltage VDD increases, the current I2 that flows during the read operation is controlled to be a constant current by the constant current source 10.

3. Third Embodiment

Figure 8:
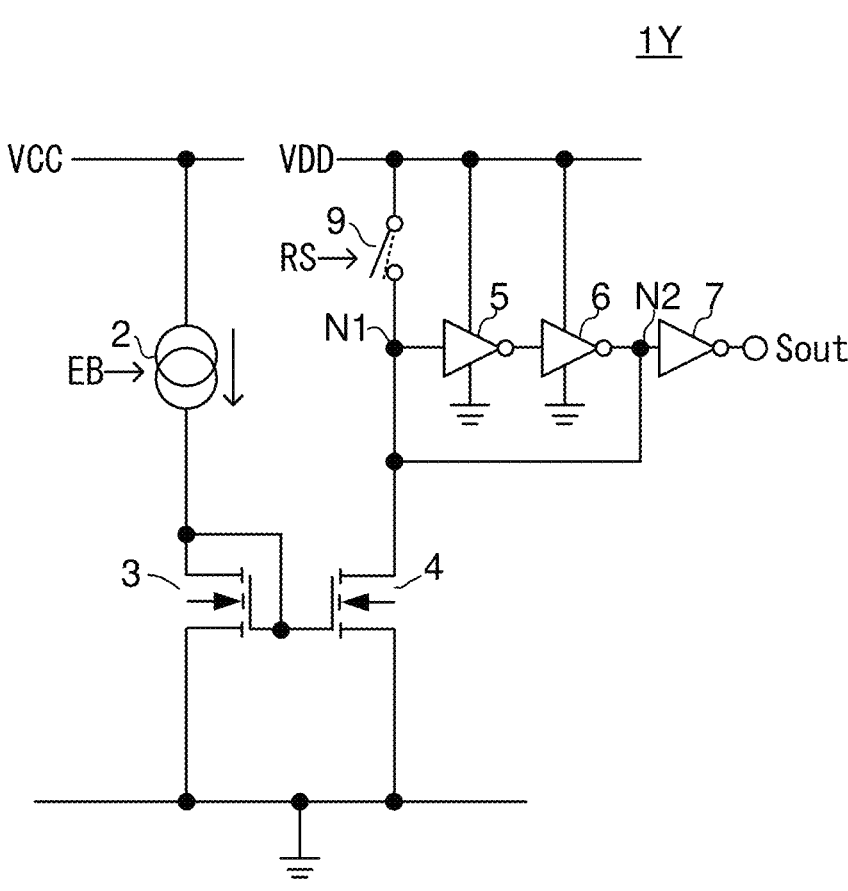
FIG. 8 is a diagram showing the configuration of a non-volatile memory device according to a third embodiment.

FIG. 8 is a diagram showing the configuration of a non-volatile memory device 1Y according to a third embodiment. The non-volatile memory device 1Y differs in configuration from the first embodiment (see FIG. 1) in that the nodes N2 and N1 are short-circuited together with the resistive element 8 omitted.

In this embodiment, the high-side PMOS transistor in the inverter 6 is given a higher on resistance and this on resistance is one example of a current limiter.

In the non-volatile memory device 1Y according to this embodiment, when with the constant current source 2 in the enable state the switch 9 is switched to the non-reset state, if the data element 4 is in a state before the program operation is performed, the PMOS transistor in the inverter 6 is on, so a current flows through a path via the application terminal for the supply voltage VDD, the PMOS transistor in the inverter 6, the node N2, and the data element 4. Thus, the node N1 is at low level, the inverters 5 and 6 keep the node N2 at low level, no current flows through the data element 4, the node N2 is latched at low level, and the output signal Sout is latched at high level.

This embodiment is, like the first embodiment, effective when the supply voltage VDD is lower than the supply voltage VCC and the variation width is small.

4. Others

The various technical features disclosed herein can be implemented in any manners other than as in the above-described embodiments with any modifications made without departure from the spirit of their technical ingenuity. That is, it should be understood that the above-described embodiments are in every aspect illustrative and not restrictive. The technical scope of the present invention is defined not by the description of the embodiments given above but by the appended claims, and encompasses any modifications made within a scope equivalent in significance to those claims.

For example, the reference element 3 and the data element 4 are not limited to ones employing hot carrier injection, and can be configured as, for example, memory elements that perform a program operation by injecting electrons into a floating gate.

5. Notes

As described above, for example, according to one aspect of the present disclosure, a non-volatile memory device (1) includes:

a memory element (4) that can perform a program operation;

a switch (9) having its first terminal connected to an application terminal for a first supply voltage (VDD);

an even number of inverters (5, 6) of which the input side is connected to a first node (N1) to which the second terminal of the switch and the memory element are connected, and a current limiter (8) that limits the current flowing through the path via the application terminal for the first supply voltage, the transistor, and the memory element when a high-side transistor (61) included in a final-stage inverter (6) which is arranged at the most final-stage in the even number of inverters is on. (A first configuration; FIGS. 1A and 1B.)

In the non-volatile memory device of the first configuration described above, the current limiter may be a resistive element (8) connected between the output terminal of the final-stage inverter (6) and the first node (N1). (A second configuration; FIG. 1A.)

In the non-volatile memory device of the first configuration described above, the current limiter may be the on resistance of the transistor (61), and the output terminal of the final-stage inverter (6) and the first node (N1) may be short-circuited together. (A third configuration; FIG. 8.)

The non-volatile memory device of the second or third configurations described above may further include:

a reference element (3) that constitutes a current mirror together with the memory element (4), and a first constant current source (2) connected between an application terminal for a second supply voltage (VCC) and the reference element.

The first supply voltage (VDD) may be a voltage lower than the second supply voltage. (A fourth configuration.)

In the non-volatile memory device of the first configuration described above, the current limiter may be a second constant current source (10) connected between the application terminal for the first supply voltage (VDD) and the transistor (61), and the output terminal of the final-stage inverter (6) and the first node (N1) may be short-circuited together. (The fifth configuration; FIG. 6.)

The non-volatile memory device of any one of the first to fifth configurations described above may further include:

a reference element (3) that constitutes a current mirror together with the memory element (4), and a first constant current source (2) connected between an application terminal for a second supply voltage (VCC) and the reference element.

The first constant current source (2) may be switchable between an enabled state and a disabled state according to an enable signal (EB), and the switch (9) may be switchable between on and off according to a reset signal (RS). (A sixth configuration.)

INDUSTRIAL APPLICABILITY

The present disclosure finds applications in, for example, non-volatile memory devices incorporated in various semiconductor devices.

REFERENCE SIGNS LIST 1, 1X, 1Y non-volatile memory device
2 constant current source
3 reference element
4 data element
5-7 inverter
8 resistive element
9 switch
10 constant current source
61 PMOS transistor
62 NMOS transistor
101 constant-current generation circuit
102, 103 PMOS transistor
N1, N2 node

The invention claimed is:

1. A non-volatile memory device comprising:

a memory element operable to perform a program operation;

a switch having a first terminal connected to an application terminal for a first supply voltage;

an even number of inverters of which an input side is connected to a first node to which a second terminal of the switch and the memory element are connected, and a current limiter configured to limit a current flowing through a path via the application terminal for the first supply voltage, the transistor, and the memory element, when a high-side transistor included in a final-stage inverter arranged in a final stage in the even number of inverters is on.

2. A non-volatile memory device according to claim 1, wherein the current limiter is a resistive element connected between an output terminal of the final-stage inverter and the first node.

3. A non-volatile memory device according to claim 1, wherein the current limiter is an on resistance of the transistor, and the output terminal of the final-stage inverter and the first node are short-circuited together.

4. A non-volatile memory device according to claim 2, further comprising:

a reference element configured to constitute a current mirror together with the memory element, and a first constant current source connected between an application terminal for a second supply voltage and the reference element, wherein the first supply voltage is a voltage lower than the second supply voltage.

5. A non-volatile memory device according to claim 1, wherein the current limiter is a second constant current source connected between the application terminal for the first supply voltage and the transistor, and the output terminal of the final-stage inverter and the first node are short-circuited together.

6. A non-volatile memory device according to claim 1, further comprising:

a reference element configured to constitute a current mirror together with the memory element, and a first constant current source connected between an application terminal for a second supply voltage and the reference element, wherein the first constant current source is switchable between an enabled state and a disabled state according to an enable signal, and the switch is switchable between on and off according to a reset signal.

* * * * *